(12) United States Patent
Lee et al.

(10) Patent No.: US 11,291,123 B2
(45) Date of Patent: Mar. 29, 2022

(54) CIRCUIT BOARD

(71) Applicants: Samwon Act Co., Ltd., Busan (KR); Emot Co., Ltd., Ansan-si Gyeonggi-do (KR); Korea Institute of Machinery & Materials, Daejeon (KR)

(72) Inventors: Kyung Yul Lee, Bucheon-si (KR); Kyung Wook Lee, Ansan-si (KR); Jun Sang Jeong, Siheung-si (KR); Yang Seok Lee, Bucheon-si (KR); Man Kim, Changwon-si (KR); Joo Yul Lee, Gimhae-si (KR); Sang Yeoul Lee, Gimhae-si (KR)

(73) Assignees: SAMWON ACT CO., LTD., Busan (KR); EMOT CO., LTD., Ansan-si (KR); KOREA INSTITUTE OF MATERIALS SCIENCE, Gyeongsangnam-Do (KR)

( * ) Notice: Subject to any disclaimer, the term of this patent is extended or adjusted under 35 U.S.C. 154(b) by 0 days.

(21) Appl. No.: 16/069,893

(22) PCT Filed: Jan. 9, 2017

(86) PCT No.: PCT/KR2017/000255
§ 371 (c)(1),
(2) Date: Jul. 13, 2018

(87) PCT Pub. No.: WO2017/122974
PCT Pub. Date: Jul. 20, 2017

(65) Prior Publication Data
US 2019/0029124 A1    Jan. 24, 2019

(30) Foreign Application Priority Data
Jan. 13, 2016   (KR) .......................... 10-2016-0004150

(51) Int. Cl.
    H05K 3/46    (2006.01)
    H05K 1/11    (2006.01)
    (Continued)

(52) U.S. Cl.
    CPC ........... *H05K 3/4623* (2013.01); *H05K 1/115* (2013.01); *H05K 3/1283* (2013.01); *H05K 3/245* (2013.01);
    (Continued)

(58) Field of Classification Search
    CPC .. H05K 3/4623; H05K 3/1283; H05K 3/4007; H05K 3/4038; H05K 1/115;
    (Continued)

(56) References Cited

U.S. PATENT DOCUMENTS 3,770,874 A  *  11/1973  Krieger ................. H01L 24/81
                                                     174/257
4,368,503 A      1/1983  Kurosawa et al.
(Continued)

FOREIGN PATENT DOCUMENTS

JP    H05-335712 A    12/1993
JP    H08-064966 A     3/1996
(Continued)

OTHER PUBLICATIONS

Definition of "terminal" from www.thefreedictionary.com provided with Office Action (Year: 2019).*
(Continued)

*Primary Examiner* — Roshn K Varghese
(74) *Attorney, Agent, or Firm* — Harness, Dickey & Pierce, P.L.C.

(57) ABSTRACT

The present invention relates to a circuit board including: a base board having a circuit region and a terminal region; a circuit pattern formed on an upper portion of the base board; and a low-melting-metal layer formed on an upper portion of
(Continued)

the circuit pattern. A circuit board capable of reducing manufacturing time and manufacturing costs may be manufactured by omitting a photoresist process.

6 Claims, 7 Drawing Sheets

(51) Int. Cl.
*H05K 3/12* (2006.01)
*H05K 3/40* (2006.01)
*H05K 3/24* (2006.01)
*H05K 3/36* (2006.01)

(52) U.S. Cl.
CPC ........... *H05K 3/368* (2013.01); *H05K 3/4007* (2013.01); *H05K 3/4038* (2013.01); *H05K 2201/0305* (2013.01); *H05K 2201/043* (2013.01); *H05K 2201/09736* (2013.01); *H05K 2203/0338* (2013.01); *H05K 2203/043* (2013.01)

(58) Field of Classification Search
CPC ... H05K 2201/09736; H05K 2203/043; H05K 2201/09381; H05K 2203/042; H05K 2203/046; H05K 2201/046; H05K 2201/0465; H05K 1/11; H01L 24/12
See application file for complete search history.

(56) References Cited

U.S. PATENT DOCUMENTS

| 5,453,582 A | * | 9/1995 | Amano | ................... | B23K 35/34 |
| | | | | | 174/261 |
| 5,892,179 A | * | 4/1999 | Rinne | ..................... | H01L 24/11 |
| | | | | | 174/261 |
| 7,213,740 B2 | * | 5/2007 | Rinne | .................. | G02B 6/4232 |
| | | | | | 228/180.22 |
| 9,466,590 B1 | * | 10/2016 | Barwicz | ................. | H01L 24/05 |

FOREIGN PATENT DOCUMENTS

| KR | 10-0957418 B1 | 5/2010 |
| KR | 10-1139050 B1 | 4/2012 |
| WO | WO-2014/058265 A1 | 4/2014 |

OTHER PUBLICATIONS

Definition of "circuit" from www.thefreedictionary.com provided with Office Action (Year: 2019).*
International Search Report PCT/ISA/210 for International Application PCT/KR2017/000255 dated Mar. 21, 2017.
Written Opinion PCT/ISA/237 for International Application PCT/KR2017/000255 dated Mar. 21, 2017.

* cited by examiner

[Fig. 1] PRIOR ART
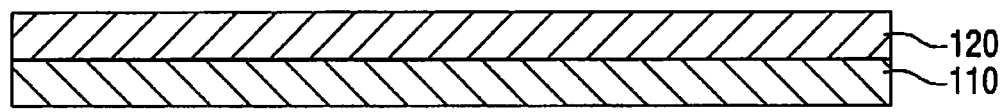
[Fig. 2] PRIOR ART
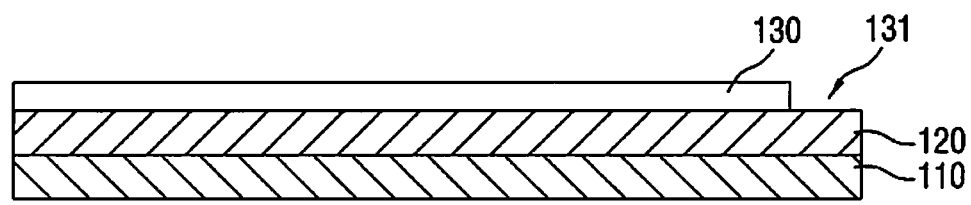
[Fig. 3] PRIOR ART
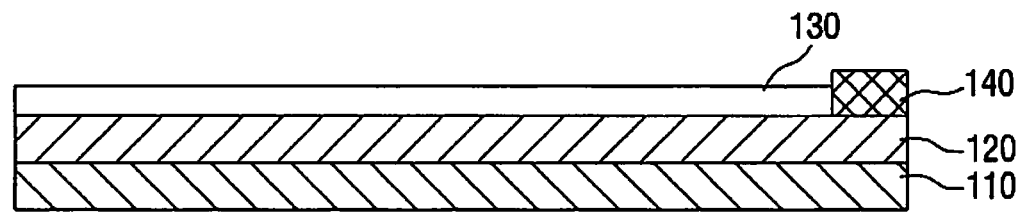

[Fig. 4] PRIOR ART
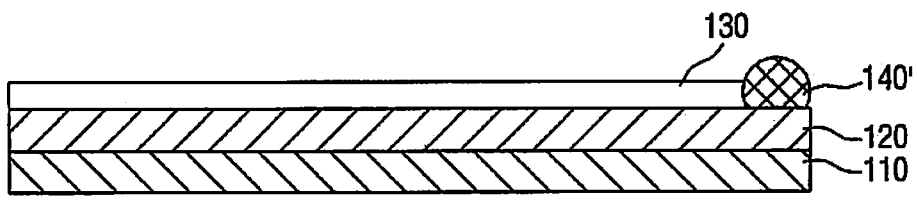

[Fig. 5]
PRIOR ART
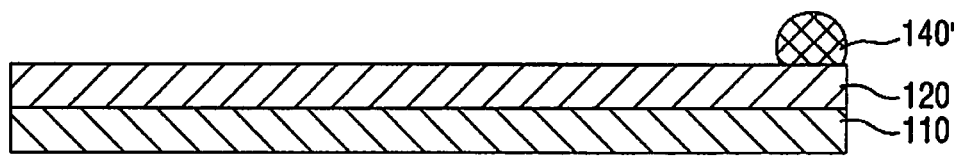
[Fig. 6]
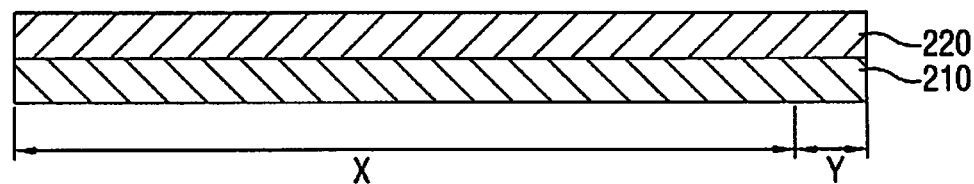
[Fig. 7]
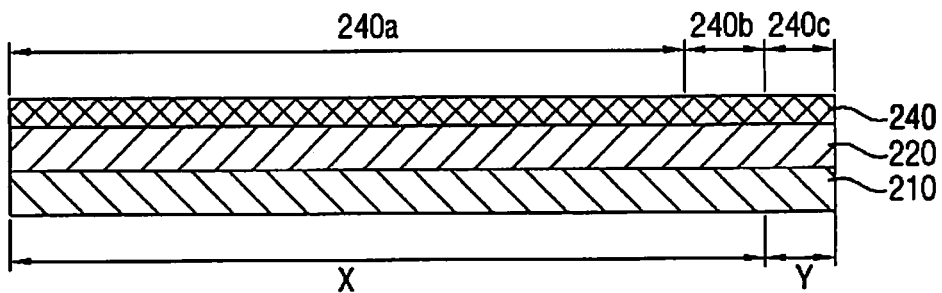

【Fig. 8】
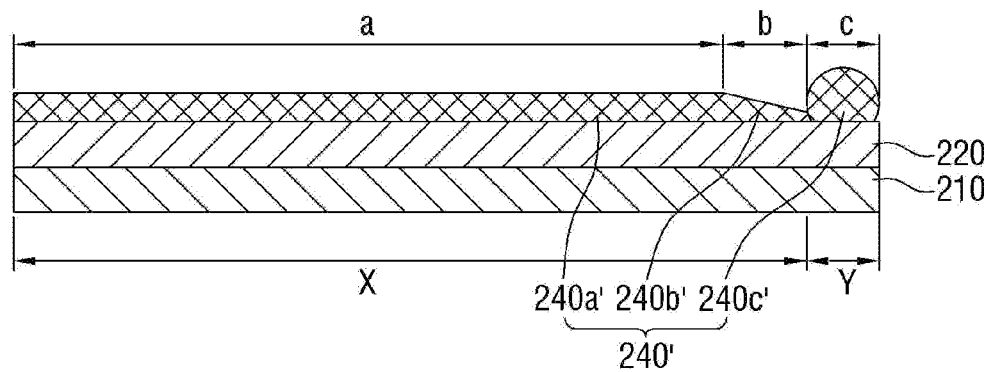
【Fig. 9】
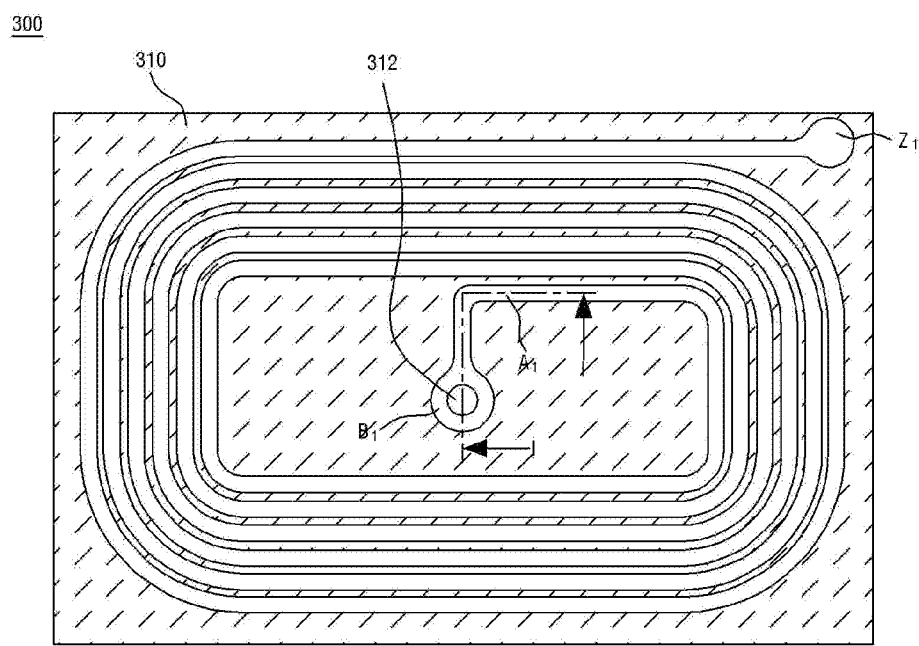

[Fig. 10]
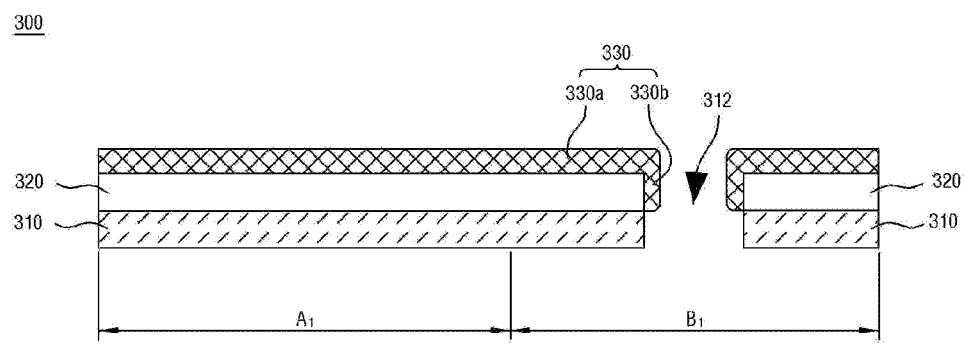
[Fig. 11]
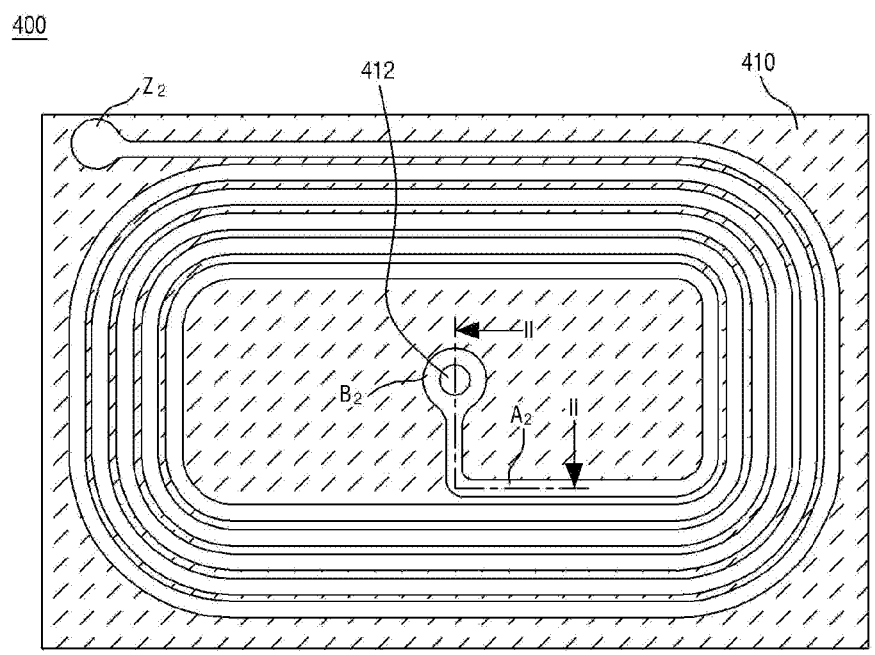

【Fig. 12】
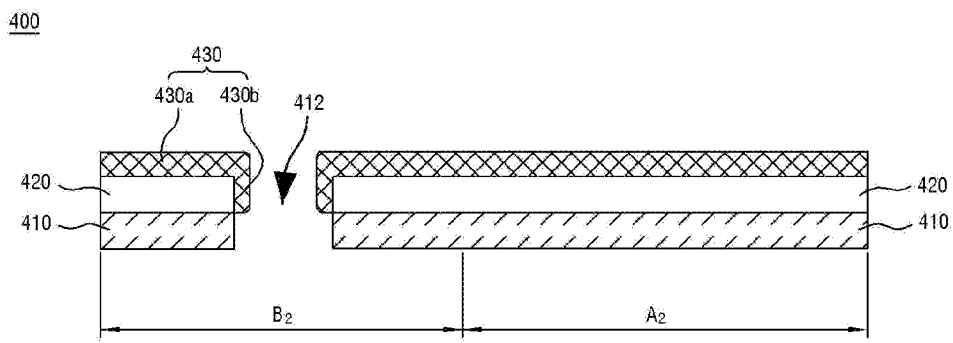
【Fig. 13】
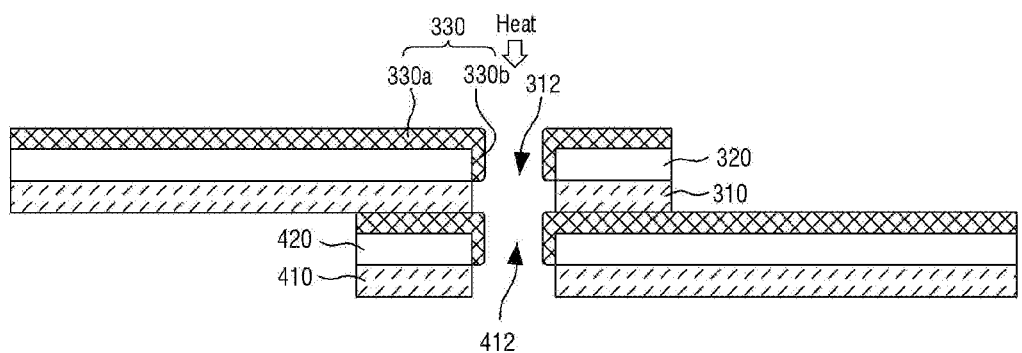
【Fig. 14】
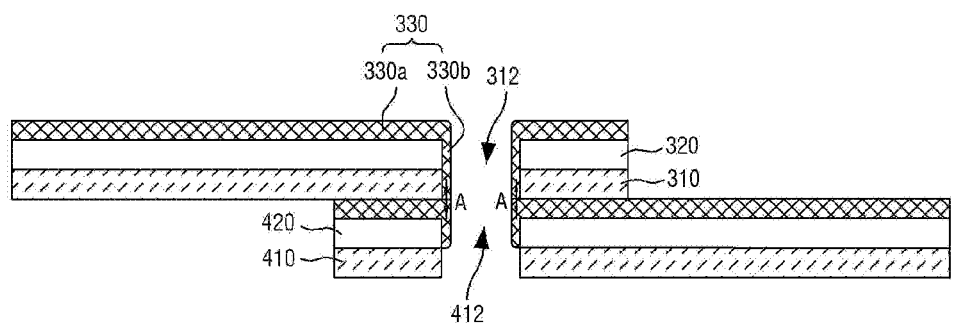

【Fig. 15】
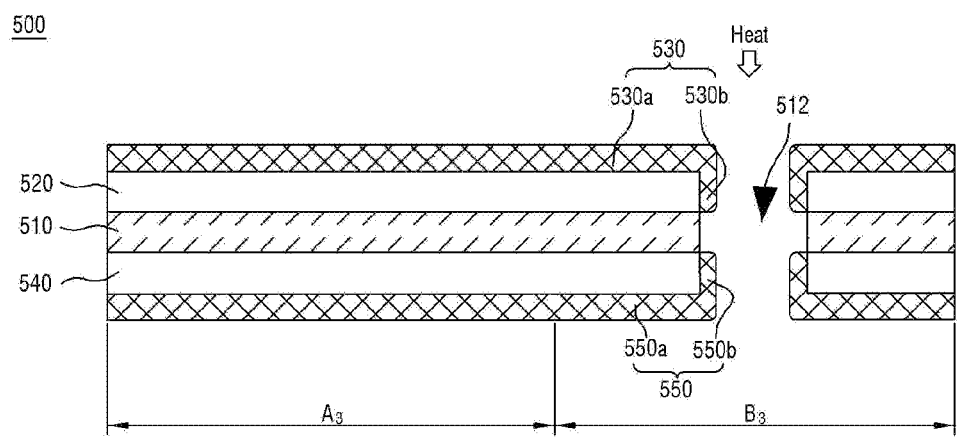
【Fig. 16】
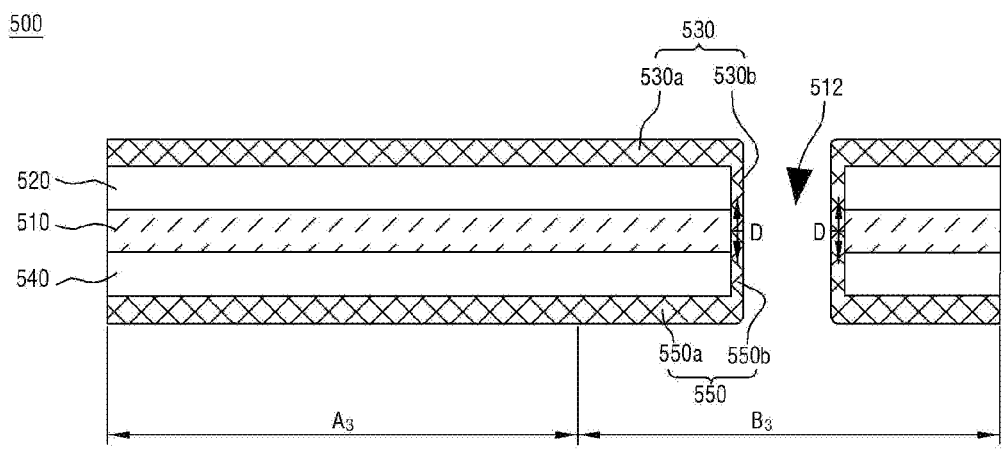

CIRCUIT BOARD

CROSS-REFERENCE TO RELATED APPLICATIONS

This is a national phase under 35 U.S.C. § 371 of PCT International Application No. PCT/KR2017/000255 which has an International filing date of Jan. 9, 2017, which claims priority to Korean Patent Application No. 10-2016-0004150 filed Jan. 13, 2016, the entire contents of each of which are hereby incorporated by reference.

TECHNICAL FIELD

The present invention relates to a circuit board, and more particularly, to a circuit board having an external connection terminal region and/or an internal connection terminal region.

BACKGROUND ART

In general, circuit boards are the most basic component in electrical and electronic products currently manufactured in many fields and are widely used in LCD TVs, DVDs, desk computers, notebook PCs, digital cameras, mobile phones, PDAs, MP3 players, and the like.

Due to the rapid development of digital methods in electric and electronic devices and the advancement of semiconductor development, application of a miniaturized, high-densified and high-performance printed circuit board has gradually expanded to being applied to digital satellite receiving devices, DVR monitoring devices, palmtop computers, semiconductor modules, semiconductor inspection devices, electronic units for a vehicle, defense industry advanced weapons such as missile warheads, combat planes, and satellites.

Such a circuit board essentially includes a terminal part for connecting a circuit printed on the circuit board and the other devices.

That is, the circuit board is divided into a circuit part and a terminal part, and the terminal part connects the circuit part of the circuit board and the other devices disposed outside the circuit board.

FIGS. 1 to 5 are schematic cross-sectional views illustrating a method of manufacturing a terminal part of a general circuit board.

First, referring to FIG. 1, in the method of manufacturing the terminal part of the general circuit board, a circuit pattern 120 is formed on a substrate 110.

The circuit board may have a circuit part and a terminal part, and the circuit pattern may be continuously formed in the circuit part and the terminal part.

In this case, the circuit pattern 120 may be made of copper or a copper alloy, and a material of the circuit pattern is not limited.

Meanwhile, although not shown in the drawings, the circuit pattern may be formed through known photoresist and etching processes.

For example, a metal thin film layer (not shown) is formed on an entire surface of the substrate 110.

Next, after a photoresist layer (not shown) is formed on an upper portion of the metal thin film layer, the photoresist layer may be exposed and developed to form a photoresist pattern (not shown) having a desired shape. The circuit pattern 120 may be formed by etching the metal thin film layer by using the formed photoresist pattern as a masking resist.

Subsequently, referring to FIG. 2, a photoresist film pattern 130 is formed on an upper portion of the circuit pattern 120.

Here, the photoresist film pattern 130 covers all regions except for the terminal part of the circuit board.

That is, the photoresist film pattern 130 has an opening region 131 for exposing the terminal part.

Next, referring to FIG. 3, a solder plating layer 140 is formed in the opening region 131 of the photoresist film pattern 130.

The solder plating layer may be made of Sn or a Sn alloy. The Sn alloy may be Sn—Cu, Sn—Ag or Sn—Bi, but a material of the solder plating layer is not limited thereto.

Meanwhile, the solder plating layer may be formed through a known electroplating method, but a method of forming the solder plating layer is not limited in the present invention.

Referring to FIG. 4, the solder plating layer 140 is heat-treated to form a soldering portion 140'.

That is, the solder plating layer 140 is heat-treated and thus is melted. While the melted solder plating layer is cooled back, the soldering portion 140' having a globular shape may be formed due to surface tension as illustrated in FIG. 4.

Thereafter, as shown in FIG. 5, the circuit board including the circuit part and the terminal part may be manufactured by removing the photoresist film formed on the substrate.

However, in a circuit board having such a general structure, a separate photoresist process should be performed when the terminal part is formed.

That is, as described above, in order to form the terminal part, it is necessary to perform a process of forming the photoresist film having the opening region for exposing the terminal part and a process of forming the solder plating layer on the terminal part by using the photoresist film as a mask. The separate photoresist process is essential.

Therefore, such a photoresist process becomes a factor which increases manufacturing time and manufacturing costs.

On the other hand, such a general circuit board may be implemented as a stacked circuit board including a plurality of stacked substrates.

In this case, in order to constitute the stacked circuit board, for example, an internal connection terminal for electrically connecting a first circuit board and a second circuit board is required.

However, in order to form an internal connection terminal in a general stacked circuit board, a separate plating layer should be formed in an internal connection terminal part. Due to increases in manufacturing processes, there are problems that contribute to increases in manufacturing time and manufacturing costs.

DISCLOSURE

Technical Problem

The present invention is directed to providing a method of manufacturing a circuit board, by which manufacturing time and manufacturing costs may be reduced by omitting a photoresist process.

In addition, the present invention is directed to providing a method of manufacturing a circuit board, by which manufacturing time and manufacturing costs may be reduced by omitting an additional plating layer forming process of forming an internal connection terminal part.

Objects of the present invention are not limited to the objects described above, and other objects that are not described will be clearly understood by a person skilled in the art from the description below.

Technical Solution

In order to solve the above-described problem, the present invention provides a circuit board including: a base board having a circuit region and a terminal region; a circuit pattern formed on an upper portion of the base board; and a low-melting-metal layer formed on an upper portion of the circuit pattern.

The low-melting-metal layer may include a first low-melting-metal layer disposed in the circuit region; a second low-melting-metal layer disposed in the terminal region; and a third low-melting-metal layer disposed in the circuit region so as to be adjacent to the terminal region.

The low-melting-metal layer may be made of a metal melted in a temperature range of 100° C. and 250° C.

The second low-melting-metal layer may be heat-treated and form a soldering portion, and the third low-melting-metal layer may be heat-treated, such that a melted portion of the third low-melting-metal layer moves to the second low-melting-metal layer (240) to form the soldering portion.

The third low-melting-metal layer may have an inclined surface.

The present invention provides a method of manufacturing a circuit board, the method including: providing a base board having a circuit region and a terminal region; forming a circuit pattern on an upper portion of the base board; forming a low-melting-metal layer which includes a first low-melting-metal layer disposed in the circuit region, a second low-melting-metal layer disposed in the terminal region, and a third low-melting-metal layer disposed in the circuit region so as to be adjacent to the terminal region; and forming a soldering portion by heat-treating the second low-melting-material layer.

The second low-melting-material layer may be heat-treated and melted and may be cooled back to form the soldering portion due to surface tension.

The second low-melting-material layer may be heat-treated and heat supplied to the second low-melting-metal layer may be transferred to the third low-melting-material layer, and a melted portion of the third low-melting-material layer may be melted and move to the second low-melting-metal layer to form the soldering portion.

The present invention provides a stacked circuit board including: a first circuit board; and a second circuit board configured to be stacked on the first circuit board, wherein the first circuit board includes a first base board having a first circuit region and a first internal connection terminal region; a first circuit pattern formed on an upper portion of the first base board; and a first low-melting-metal layer disposed on an upper portion of the first circuit pattern, wherein the first internal connection terminal region has a first through-hole region, and the first through-hole region includes a first side low-melting-metal layer, and the second circuit board includes a second base board having a second circuit region and a second internal connection terminal region; a second circuit pattern formed on an upper portion of the second base board; and a second low-melting-metal layer disposed on an upper portion of the second circuit pattern, wherein the second internal connection terminal region has a second through-hole region, and the second through-hole region includes a second side low-melting-metal layer.

The stacked circuit board may further include a connection portion at which the first side low-melting-metal layer and the second side low-melting-metal layer are connected to each other.

The present invention provides a double-sided circuit board including: a base board having a circuit region and an internal connection terminal region; a first circuit pattern formed on a first surface of the base board; a first low-melting-metal layer disposed on an upper portion of the first circuit pattern; a second circuit pattern formed on a second surface of the base board; and a second low-melting-metal layer disposed on an upper portion of the second circuit pattern, wherein the first low-melting-metal layer includes a first upper low-melting-metal layer disposed on an upper surface of the first circuit pattern and a first side low-melting-metal layer disposed on a side surface of the first circuit pattern, and the second low-melting-metal layer includes a second upper low-melting-metal layer disposed on an upper surface of the second circuit pattern and a second side low-melting-metal layer disposed on a side surface of the second circuit pattern, and the internal connection terminal region has a through-hole region, and the through-hole region includes the first side low-melting-metal layer and the second side low-melting-metal layer.

The double-sided circuit board may further include a connection portion at which the first side low-melting-metal layer and the second side low-melting-metal layer are connected to each other.

Advantageous Effects

According to the present invention, a circuit board capable of reducing manufacturing time and manufacturing costs can be manufactured by omitting a photoresist process.

In addition, a circuit board capable of reducing manufacturing time and manufacturing costs may be manufactured by omitting an additional plating layer forming process of forming an internal connection terminal part.

Furthermore, according to the present invention, since a terminal region has a through-hole region, a stacked circuit board can be manufactured through a straightforward method.

DESCRIPTION OF DRAWINGS

FIGS. 1 to 5 are schematic cross-sectional views illustrating a method of manufacturing a terminal part of a general circuit board.

FIGS. 6 to 8 are schematic cross-sectional views illustrating a method of manufacturing a terminal part of a circuit board according to the present invention.

FIG. 9 is a schematic plan view illustrating a first circuit board according to the present invention, and FIG. 10 is a cross-sectional view taken along line I-I of FIG. 9, i.e., the schematic plan view illustrating the first circuit board according to the present invention.

FIG. 11 is a schematic plan view illustrating a second circuit board according to the present invention, and FIG. 12 is a sectional view taken along line II-II of FIG. 11, i.e., the schematic plan view illustrating the second circuit board according to the present invention.

FIGS. 13 and 14 are schematic cross-sectional views illustrating a method of manufacturing a stacked circuit board according to the present invention.

FIG. 15 is a schematic cross-sectional view illustrating a circuit board of a modified example according to the present invention, and FIG. 16 is a schematic cross-sectional view illustrating a method of electrically connecting an upper surface and a lower surface in the circuit board of the modified example according to the present invention.

BEST MODE FOR CARRYING OUT THE INVENTION

The advantages, features, and schemes of achieving the advantages and features of the present exemplary embodiments will be made apparent to and comprehended by those skilled in the art based on the exemplary embodiments, which will be described later in detail, together with accompanying drawings. The present exemplary embodiments are not limited to the following exemplary embodiments but include various applications and modifications. The present exemplary embodiments will make the disclosure of the present invention complete, and allow those skilled in the art to completely comprehend the scope of the present invention. The present exemplary embodiments are only defined within the scope of accompanying claims.

References will now be made in detail to the present embodiments of the present invention, examples of which are illustrated in the accompanying drawings, wherein like reference numerals refer to the like elements throughout. As used herein, the term "and/or" includes any and all combinations of one or more of the associated listed items.

It should be understood that, although terms such as "first," "second," and the like may be used herein to describe various components, these components are not limited by these terms. These terms are only used to distinguish one element or component from another element or component. Therefore, a first component could be termed a second component without departing from the scope and spirit of the present invention.

The terms used in the present specification are for explaining the exemplary embodiments rather than limiting the present invention. As used herein, the singular forms "a", "an" and "the" are intended to include the plural forms as well, unless the context clearly indicates otherwise. The meaning of "comprises" and/or "comprising" used in this specification does not exclude the existence or addition of one or more other constituent elements in addition to the mentioned constituent elements.

Unless otherwise defined, all terms (including technical and scientific terms) used in the present specification may be used as the same meaning which may be commonly understood by the person with ordinary skill in the art, to which the present invention belongs. It will be further understood that terms defined in commonly used dictionaries should not be interpreted in an idealized or excessive sense unless expressly and specifically defined.

Spatially relative terms, such as "below," "beneath," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the exemplary term "below" can encompass both an orientation of above and below. Since an element may be oriented in another direction, the spatially-relative terms may be interpreted in accordance with the orientation of the element.

Hereinafter, exemplary embodiments of the present invention will be described in detail with reference to the accompanying drawings.

FIGS. 6 to 8 are schematic cross-sectional views illustrating a method of manufacturing a terminal part of a circuit board according to the present invention.

Here, the terminal part according to the present invention may correspond to region Z1 of FIG. 9 or region Z2 of FIG. 10 to be described later.

First, referring to FIG. 6, in the method of manufacturing the terminal part of the circuit board according to the present invention, a base board 210 is provided.

The base board corresponds to a base for mounting components and forming a circuit of the circuit board according to the present invention. The base board may be made of a polyester (PET) or polyimide (PI) material, but a material of the base board is not limited in the present invention.

In addition, the base board may have a circuit region X and a terminal region Y.

The circuit region X corresponds to a region in which the circuit of the circuit board is printed or formed. The terminal region Y corresponds to a region in which the circuit part of the circuit board is connected to the other devices disposed outside the circuit board.

Next, referring to FIG. 6, a circuit pattern 220 is formed on an upper portion of the base board.

The circuit pattern 220 may be divided into a first circuit pattern disposed in the circuit region X and a second circuit pattern disposed in the terminal region Y. That is, the circuit pattern may be continuously formed in the circuit region and the terminal region.

In this case, the circuit pattern 220 may be made of copper or a copper alloy, and a material of the circuit pattern is not limited in the present invention.

Meanwhile, although not shown in the drawings, the circuit pattern may be formed through a known photoresist process.

For example, a metal thin film layer (not shown) is formed on an entire surface of the substrate 210.

Next, a photoresist layer (not shown) is formed on an upper portion of the metal thin film layer, and then, the photoresist layer is exposed and developed to form a photoresist pattern (not shown) having a desired shape.

In this case, the photoresist pattern is formed to correspond to a shape of a circuit pattern to be formed.

Next, the metal thin film layer may be etched by using the formed photoresist pattern as a masking resist to form the circuit pattern 220, and then, the photoresist pattern may be removed to form the circuit pattern 220.

Since the formation of the circuit pattern through such a photoresist process is obvious to a person skilled in the art to which the invention pertains, a detailed description thereof will be omitted.

In addition, the circuit pattern may be formed through a known transfer process.

For example, the circuit pattern may be manufactured by forming a mold having a certain pattern thereon, corresponding to the circuit pattern, and forming a circuit pattern on the certain pattern formed on the mold through a known electroplating method.

Since the formation of the circuit pattern through such a mold is obvious to a person skilled in the art to which the invention pertains, a detailed description thereof will be omitted.

On the other hand, the method of forming the circuit pattern is not limited in the present invention.

Next, referring to FIG. 7, a low-melting-metal layer 240 is formed on the circuit pattern 220.

The low-melting-metal layer may be made of Sn or a Sn alloy. In this case, the Sn alloy may be Sn—Cu, Sn—Ag or Sn—Bi, but a material of the low-melting-metal layer is not limited thereto.

However, the low melting metal may be defined as a metal which is melted in a temperature range of 100° C. to 250° C. Thus, a metal melted in the temperature range may be classified as the low melting metal according to the present invention.

In this case, the low-melting-metal layer 240 may include a first low-melting-metal layer 240a disposed in the circuit region X, a second low-melting-metal layer 240c disposed in the terminal region Y, and a third low-melting-metal layer 240b disposed in the circuit region so as to be disposed adjacent to the terminal region.

In the present invention, the first to third low-melting-metal layers are continuously formed. However, for convenience of description, a description will be made by being divided into the first low-melting-metal layer 240a disposed in the circuit region X, the second low-melting-metal layer 240c disposed in the terminal region Y, and the third low-melting-metal layer 240b disposed in the circuit region so as to be disposed adjacent to the terminal region.

The low-melting-metal layer 240 may be made of Pb—Sn or Pb, but a material of the low-melting-metal layer is not limited in the present invention.

Meanwhile, the low-melting-metal layer 240 may be formed through a known electroplating method. When the low-melting-metal layer is formed through the electroplating method, the circuit pattern 220 may be used as an electrode for applying an electric field.

For example, as described above, the circuit pattern may be formed through a known transfer process.

That is, the circuit pattern may be manufactured by forming a mold having a certain pattern thereon, corresponding to the circuit pattern, and forming a circuit pattern on the certain pattern formed on the mold through a known electroplating method.

Thereafter, the mold having the circuit pattern formed thereon is immersed in an electroplating bath, and an electric field is applied to the circuit pattern, thereby forming the low-melting-metal layer on the circuit pattern.

However, a method of forming the low-melting-metal layer is not limited in the present invention.

Next, referring to FIG. 8, the second low-melting-metal layer 240c is heat-treated to form a soldering portion 240c'.

That is, the second low-melting-metal layer 240c may be heat-treated and thus be melted. While the melted second low-melting-metal layer 240c is cooled back, the soldering portion 240' having a globular shape may be formed due to surface tension as illustrated in FIG. 8.

In this case, when the second low-melting-metal layer 240c is heat-treated, heat supplied to the second low-melting-metal layer 240c is also transferred to the third low-melting-metal layer 240b.

That is, in the case of a third solder plating 240b disposed in a region adjacent to the second low-melting-metal layer 240c, a portion of the third low-melting-metal layer 240b may be melted due to the transferred heat.

Accordingly, as shown in FIG. 8, the melted portion of the melted third low-melting-metal layer 240b moves to the second low-melting-metal layer 240 to form the soldering portion 240c'.

Therefore, the second low-melting-metal layer forms the soldering portion 240c'. The third low-melting-metal layer forms the low-melting-metal layer 240c' having an inclined surface. The first low-melting-metal layer maintains an original shape.

As described above, in a circuit board having a general structure, a separate photoresist process should be performed when the terminal part is formed.

That is, in the general structure, in order to form the terminal part, it is necessary to perform a process of forming a photoresist film including an opening region for exposing the terminal part and a process of forming a solder plating layer on the terminal part by using the photoresist film as a mask. A separate photoresist process is essential.

Therefore, such a photoresist process becomes a factor which increases manufacturing time and manufacturing costs.

However, in the present invention, a circuit board capable of reducing manufacturing time and manufacturing costs can be provided by omitting such a photoresist process.

Conventionally, in order to secure a certain thickness of the soldering portion when the soldering portion is formed, it has been necessary to allow a solder plating layer to have a certain thickness or more.

For example, only when the solder plating layer is plated to have a thickness of 15 μm to 20 μm, a thickness of the soldering portion formed in a subsequent process has been secured.

However, in the present invention, when the soldering portion is formed, the second low-melting-metal layer 240c disposed in the terminal region Y forms the soldering portion, and the portion of the third low-melting-metal layer 240b moves to the second low-melting-metal layer 240 to form the soldering portion 240c'. Thus, even when the low-melting-metal layer is made thinner than the conventional low-melting-metal layer, it is possible to secure the thickness of the soldering portion.

For example, in the present invention, even when the low-melting-metal layer is plated to have a thickness of 5 μm to 10 μm, it is possible to secure the thickness of the soldering portion.

When the thickness of the low-melting-metal layer is less than 5 μm, soldering characteristics may be lowered when the soldering portion is formed. When the thickness of the low-melting-metal layer exceeds 10 μm, there is no advantage in terms of thickness compared to a conventional method. Accordingly, it is preferable that the thickness of the low-melting-metal layer is in a range of 5 μm to 10 μm.

Here, in the present invention, it is preferable that a ratio of a thickness of the circuit pattern to a thickness of the low-melting-metal layer is in a range of 1:1 to 3:1.

Hereinafter, an application example of the circuit board according to the present invention will be described.

Here, an application example of the circuit board according to the present invention described below relates to an application example in which a plurality of circuit boards are stacked, more particularly, to a circuit board having a through-hole region.

That is, a case in which a circuit board according to the present invention has a stacked structure of a plurality of circuit boards rather than a single board will be described below. The terminal region for connecting the other devices disposed outside the circuit board has been described with reference to FIGS. 6 to 8. An internal connection terminal for electrically connecting a plurality of circuit boards to each other in order to constitute a stacked circuit board will be described below.

Modes of the Invention

FIG. 9 is a schematic plan view illustrating a first circuit board according to the present invention, and FIG. 10 is a cross-sectional view taken along line I-I of FIG. 9, i.e., the schematic plan view illustrating the first circuit board according to the present invention.

As described above, region Z1 of FIG. 9 corresponds to the terminal region shown in FIGS. 6 to 8, and the cross-sectional region along line I-I line of FIG. 9 corresponds to an internal connection terminal region for connecting a plurality of circuit boards.

Referring to FIGS. 9 and 10, a first circuit board 300 according to the present invention includes a first base board 310. The first base board 310 may have a first circuit region A1 and a first internal connection terminal region B1.

Here, a first external connection terminal part Z1 connected to an external element may be placed in one end of the first circuit region A1.

Referring FIGS. 9 and 10, the first internal connection terminal region B1 of the first circuit board according to the present invention has a first through-hole region 312.

Generally, a through-hole means a hole in which other elements do not exist in a lower portion thereof.

For example, assuming that the first internal connection terminal region B1 has a certain hole, the certain hole may be defined as a via hole when a lower portion of the first internal connection terminal region B1 is blocked by other elements. The through-hole as in the present invention means that the lower portion of the first internal connection terminal region B1 is not blocked by other elements.

Accordingly, in the present invention, a case in which the first internal connection terminal region B1 has the first through-hole region 312 means that a region of the base board 310, corresponding to the through-hole region 312, is also cut and thus other elements to be disposed in a lower region of the first through-hole do not exist as shown in FIG. 10.

Referring to FIG. 10, as described above, the first circuit board 300 according to the present invention includes the first base board 310 having the first circuit region A1 and the first internal connection terminal region B1; a first circuit pattern 320 formed on an upper portion of the first base board 310; and a first low-melting-metal layer 330 disposed on an upper portion of the first circuit pattern 320.

The circuit pattern and the low-melting-metal layer are the same as those described with reference to FIGS. 6 to 8, and a detailed description thereof will be omitted.

In this case, as shown in FIG. 10, the first low-melting-metal layer 330 may be divided into a first upper low-melting-metal layer 330a disposed on an upper surface of the first circuit pattern 320 and a first side low-melting-metal layer 330b disposed on a side surface of the first circuit pattern 320.

As described above, the first low-melting-metal layer 330 may be formed through a known electroplating method. When the first low-melting-metal layer is formed through the electroplating method, the first circuit pattern 320 may be used as an electrode for applying an electric field.

Therefore, the first low-melting-metal layer 330 formed through the electroplating method may be formed on the upper surface of the first circuit pattern as well as the side surface of the first circuit pattern. That is, the first low melting material layer 330 may be divided into the first upper low-melting-metal layer 330a disposed on the upper surface of the first circuit pattern 320 and the first side low-melting-metal layer 330b disposed on the side surface of the first circuit pattern 320.

In this case, the formation of the first side low-melting-metal layer 330b on the side surface of the first circuit pattern 320 means that the low-melting-metal layer is disposed in the first through-hole region 312.

This corresponds to the most basic technical content in an application example of the circuit board according to the present invention. In the application example of the circuit board according to the present invention, the first circuit board 300 includes the first base board 310 having the first circuit region A1 and the first internal connection terminal region B1; the first circuit pattern 320 formed on the upper portion of the first base board 310; and the first low-melting-metal layer 330 disposed on the upper portion of the first circuit pattern 320. In addition, the first internal connection terminal region B1 has the first through-hole region 312, and the first through-hole region 312 includes the first side low-melting-metal layer 330b.

Roles of the first side low-melting-metal layer 330b will be described later.

Hereinafter, the above-described a second circuit board to be stacked on the first circuit board will be described.

FIG. 11 is a schematic plan view illustrating a second circuit board according to the present invention, and FIG. 12 is a sectional view taken along line II-II of FIG. 11, i.e., the schematic plan view illustrating the second circuit board according to the present invention.

As described above, region Z2 of FIG. 11 corresponds to the terminal region shown in FIGS. 6 to 8, and a cross-sectional region along line I-I line of FIG. 11 corresponds to an internal connection terminal region for connecting a plurality of circuit boards.

Referring to FIGS. 11 and 12, a second circuit board 400 according to the present invention includes a second base board 410. The second base board 410 may have a second circuit region A2 and a second internal connection terminal region B2.

Here, a second external connection terminal part Z2 connected to an external element may be placed in one end of the second circuit region A2.

Referring FIGS. 11 and 12, the second internal connection terminal region B2 of the second circuit board according to the present invention has a second through-hole region 412.

Since the concept of a through-hole is the same as that described above, a detailed description thereof will be omitted. Accordingly, in the present invention, a case in which the second internal connection terminal region B2 has the second through-hole region 412 means that a region of the second base board 410, corresponding to the second through-hole region 412, is also cut and thus other elements to be disposed in a lower region of the second through-hole region do not exist as shown in FIG. 12.

Referring to FIG. 12, as described above, the second circuit board 400 according to the present invention includes the second base board 410 having the second circuit region A2 and the second internal connection terminal region B2; a second circuit pattern 420 formed on an upper portion of the second base board 410; and a second low-melting-metal layer 430 disposed on an upper portion of the second circuit pattern 420.

In this case, as shown in FIG. 12, the second low-melting-metal layer 430 may be divided into a upper second lowmelting-metal layer 430*a* disposed on an upper surface of the second circuit pattern 420 and a second side low-melting-metal layer 430*b* disposed on a side surface of the second circuit pattern 420.

As described above, the second low-melting-metal layer 430 may be formed through a known electroplating method. When the second low-melting-metal layer is formed through the electroplating method, the second circuit pattern 420 may be used as an electrode for applying an electric field.

Therefore, the second low-melting-metal layer 430 formed through the electroplating method may be formed on the upper surface of the second circuit pattern as well as the side surface of the second circuit pattern. That is, the second low-melting-material layer 430 may be divided into the second upper low-melting-metal layer 430*a* disposed on the upper surface of the second circuit pattern 420 and the second side low-melting-metal layer 430*b* disposed on the side surface of the second circuit pattern 420.

In this case, the formation of the second side low-melting-metal layer 430*b* on the side surface of the second circuit pattern 420 means that the low-melting-metal layer is disposed in the second through-hole region 412.

This corresponds to the most basic technical content in an application example of the circuit board according to the present invention. In the application example of the circuit board according to the present invention, the second circuit board 300 includes the second base board 410 having the second circuit region A2 and the second internal connection terminal region B2; the second circuit pattern 420 formed on the upper portion of the second base board 410; and the second low-melting-metal layer 430 disposed on the upper portion of the second circuit pattern 420. In addition, the second internal connection terminal region B2 has the second through-hole region 412, and the second through-hole region 412 includes the second side low-melting-metal layer 430*b*.

As described above, the application example of the circuit board according to the present invention relates to an application example for when a plurality of circuit boards are stacked.

That is, in the present invention, a stacked circuit board may be formed by stacking the first circuit board 300 and the second circuit board 400. Thus, the stacked circuit board according to the present invention may be formed by electrically connecting the first circuit board and the second circuit board through the first through-hole region 312 included in first internal connection terminal region B1 and the second through-hole region 412 included in the second internal connection terminal region B2.

Hereinafter, a method of manufacturing a stacked circuit board by stacking a first circuit board and a second circuit board will be described.

FIGS. 13 and 14 are schematic cross-sectional views illustrating a method of manufacturing a stacked circuit board according to the present invention.

FIGS. 13 and 14 illustrate a stacked structure of the cross-sectional views shown in FIGS. 10 and 12 for convenience of description.

First, as shown in FIG. 13, the first circuit board 300 and the second circuit board 400 are stacked such that the first through-hole region 312 included in first internal connection terminal region B1 of the first circuit board 300 corresponds to the second through-hole region 412 included in the second internal connection terminal region B2 of the second circuit board 400.

Here, the first through-hole region 312 includes the first side low-melting-metal layer 330*b*, and the second through-hole region 412 includes the second side low-melting-metal layer 430*b*. Therefore, as the first through-hole region 312 and the second through-hole region 412 are stacked so as to correspond to each other, the first side low-melting-metal layer 330*b* and the second side low-melting-metal layer 430*b* may be stacked so as to correspond to each other.

In addition, in the stacked circuit board according to the present invention, since the first through-hole region 312 and the second through-hole region 412 are stacked so as to correspond to each other, as the first through-hole region 312 and the second through-hole region 412 are connected, the stacked circuit board has the continuous through-hole regions 312 and 412.

Here, when a separate heat source Heat applies heat to the continuous through-hole regions 312 and 412, as shown in FIG. 14, the first side low-melting-metal layer 330*b* and the second side low-melting-metal layer 430*b* are reflowed to provide a connection portion C at which the first side low-melting-metal layer 330*b* and the second side low-melting-metal layer 430*b* are connected to each other.

In this case, the heat source Heat may include various means such as a heating device, a laser device, and a pulse device, and the type of the heat source is not limited in the present invention.

That is, in the present invention, since the first circuit board and the second circuit board are electrically connected through the connection portion A, it is possible to manufacture a stacked circuit board including a plurality of stacked circuits boards.

On the other hand, while the stacked circuit board including two stacked circuits boards is illustrated in the drawings, it is possible to manufacture a stacked circuit board including at least two stacked circuit boards.

For example, a plurality of circuit boards may each include a through-hole region, and a stacked circuit board may be manufactured by stacking the plurality of stacked circuits such that all the through-hole regions correspond to each other. Therefore, a type of a stacked circuit board is not limited in the present invention.

As described above, in order to manufacture a stacked circuit board, a general circuit board requires, for example, an internal connection terminal for electrically connecting a first circuit board and a second circuit board.

However, in order to form the internal connection terminal in the general stacked circuit board, a separate plating layer should be formed in an internal connection terminal part. This increases manufacturing processes, which become a factor which increases manufacturing time and manufacturing costs.

However, in the present invention, since the low-melting-metal layer is formed on the upper portion of the circuit pattern, an internal connection terminal is formed through the low-melting-metal layer, more specifically, the side low-melting-metal layer disposed in the through-hole region, it is possible to omit a process of forming a separate plating layer as in a general process.

Hereinafter, a modified example of the circuit board according to the present invention will be described.

In this case, a modified example of the circuit board according to the present invention to be described below relates to a double-sided circuit board in which a circuit pattern is formed on each of an upper surface and a lower surface of a base board, that is, relates to a circuit board having a through-hole region for electrically connecting circuit patterns of an upper surface and a lower surface of a double-sided circuit board.

FIG. 15 is a schematic cross-sectional view illustrating a circuit board of a modified example according to the present invention, and FIG. 16 is a schematic cross-sectional view illustrating a method of electrically connecting an upper surface and a lower surface in the circuit board of the modified example according to the present invention.

In this case, FIG. 15 may be understood as an area along line I-I of FIG. 9.

Referring to FIG. 15, the modified example of the circuit board according to the present invention relates to a double-sided circuit board 500. The double-sided circuit board 500 includes a third base board 510. The third base board 510 may have a third circuit region A3 and a third internal connection terminal region B3.

In addition, the third internal connection terminal region B3 of the double-sided circuit board according to the present invention has a third through-hole region 512.

Generally, a through-hole means a hole in which other elements do not exist in a lower portion thereof. That is, a case in which the third internal connection terminal region B3 has the third through-hole region 512 means that a region of the base board 510, corresponding to the third through-hole region 512, is also cut and thus other elements to be disposed in a lower region of the third through-hole region do not exist.

Referring to FIG. 15, as described above, the double-sided circuit board 500 according to the present invention includes the third base board 510 having the third circuit region A3 and the third internal connection terminal region B3; a first circuit pattern 520 formed on a first surface of the third base board 510; and a first low-melting-metal layer 530 disposed on an upper portion of the first circuit pattern 520; a second circuit pattern 540 formed on a second surface of the third base board 510; and a second low-melting-metal layer 550 disposed on an upper portion of the second circuit pattern 540.

The circuit patterns and the low-melting-metal layers are the same as those described with reference to FIGS. 6 to 8, and a detailed description thereof will be omitted.

In this case, as shown in FIG. 15, the first low-melting-metal layer 530 may be divided into a first upper low-melting-metal layer 530a disposed on an upper surface of the first circuit pattern 520 and a first side low-melting-metal layer 530b disposed on a side surface of the first circuit pattern 520.

In this case, the formation of the first side low-melting-metal layer 530b on the side surface of the first circuit pattern 520 means that a low-melting-metal layer is disposed in the third through-hole region 512.

In addition, the second low-melting-metal layer 550 may be divided into a second upper low-melting-metal layer 550a disposed on an upper surface of the second circuit pattern 540 and a second side low-melting-metal layer 550b disposed on a side surface of the second circuit pattern 540.

In this case, the formation of the second side low-melting-metal layer 550b on the side surface of the first circuit pattern 520 means that a low-melting-metal layer is disposed in the third through-hole region 512.

Next, referring to FIG. 16, when a separate heat source Heat applies heat to the third through-hole region 512, the first side low-melting-metal layer 530b and the second side low-melting-metal layer 550b are reflowed to provide a connection portion D at which the first side low-melting-metal layer 530b and the second side low-melting-metal layer 550b are connected to each other.

That is, in the present invention, the first circuit pattern disposed on the first surface of the base board and the second circuit pattern disposed on the second surface of the base board may be electrically connected to each other.

Although exemplary embodiments of the present invention has been described with reference to the accompanying drawings, it should be understood that those skilled in the art can carry out other modifications without changing its technical spirit or essential features. Therefore, the above-described exemplary embodiments of the present invention are merely exemplary in all aspects and should not be construed to be limited.

The invention claimed is:

1. A circuit board comprising:
a base board having a circuit and a terminal, the circuit corresponding to a circuit of the circuit board, the terminal configured to electrically connect the circuit board to other devices, the circuit and terminal being separate non-overlapping areas;
a circuit pattern on an upper surface of the base board including the circuit and the terminal; and
a low-melting-metal layer directly on an upper surface of the circuit pattern, wherein the low-melting-metal layer is made of a metal melted in a temperature range of 100° C. and 250° C., the low-melting-metal layer including
a first low-melting-metal layer above the circuit;
a second low-melting-metal layer above the terminal, the terminal being only a portion configured to electrically connect the circuit pattern and an external device and having a globular shape; and
a third low-melting-metal layer above the circuit, and between first low-melting-metal layer and second low-melting-metal layer,
wherein the third low-melting-metal layer has a continuously inclined surface with a lower end at the second low-melting-metal layer, immediately adjacent the terminal, and a higher end at the first low-melting-metal layer, the higher end being co-planar with a connecting plane of the first low-melting-metal layer, the connecting plane of the first low-melting-metal layer being lower than a highest plane of the second low-melting-metal layer, the first low-melting-metal layer having a greater overall length on the circuit pattern than an overall length of the second low-melting-metal layer and an overall length of the third low-melting-metal layer on the circuit pattern.

2. The circuit board of claim 1, wherein
the second low-melting-metal layer is a soldering portion based on heat-treatment, and
the third low-melting-metal layer, based on heat-treatment, partially moves into the second low-melting-metal layer to form the soldering portion.

3. The circuit board of claim 1, wherein
a circuit region corresponding to the circuit of the circuit pattern excluding the terminal, and
a terminal region being only a portion of the circuit pattern configured to electrically connect the circuit board to other devices.

4. The circuit board of claim 1, wherein the terminal has not been connected to the external device.

5. The circuit board of claim 1, wherein the first low-melting-metal layer has a planar top surface.

6. A method of manufacturing a circuit board, the method comprising:
providing a base board having a circuit and a terminal, the circuit and terminal being separate non-overlapping areas;

forming a circuit pattern on an upper surface of the base board;

forming a low-melting-metal layer directly on an upper surface of the circuit pattern which includes
- a first low-melting-metal layer above the circuit,
- a second low-melting-metal layer above the terminal, the terminal being only a portion configured to electrically connect the circuit pattern and an external device and having a globular shape, and
- a third low-melting-metal layer above the circuit, and between first low-melting-metal layer and the second low-melting-metal layer; and forming a soldering portion by heat-treating the second low-melting-metal layer and third low-melting-metal layer, a melted portion of the third low-melting-metal layer flows into the second low-melting-metal layer, and the heat-treated third low-melting-metal layer has a continuously inclined surface with a lower end at the second low-melting-metal layer and a higher end at the first low-melting-metal layer, the higher end being co-planar with a connecting plane of the first low-melting-metal layer, the connecting plane of the first low-melting-metal layer being lower than a highest plane of the second low-melting-metal layer, the first low-melting-metal layer having a greater overall length on the circuit pattern than an overall length of the second low-melting-metal layer and an overall length of the third low-melting-metal layer on the circuit pattern, wherein the circuit corresponds to a circuit of the circuit board, and the terminal is configured to electrically connect the circuit board to other devices, and wherein the low-melting-metal layer is made of a metal melted in a temperature range of 100° C. and 250° C.

* * * * *